United States Patent [19]

Hutton et al.

[11] Patent Number: 5,430,385
[45] Date of Patent: Jul. 4, 1995

[54] TEST FIXTURE FOR PRINTED CIRCUIT BOARDS HAVING A DUAL SEAL SYSTEM

[75] Inventors: Gordon R. Hutton, Barrington, R.I.; Frederick Kirr, Chandler, Ariz.

[73] Assignee: H+W Test Products, Inc., Seekonk, Mass.

[21] Appl. No.: 290,152

[22] Filed: Aug. 15, 1994

[51] Int. Cl.⁶ ............................................ G01R 31/00
[52] U.S. Cl. .................................. 324/754; 324/761; 277/58; 277/226; 277/180; 277/198
[58] Field of Search .................. 324/754, 761; 277/58, 277/226, 180, 198

[56] References Cited

U.S. PATENT DOCUMENTS

| | | |
|---|---|---|
| 4,230,985 | 10/1980 | Matrone et al. |
| 4,344,033 | 8/1982 | Stowers et al. |
| 4,352,061 | 9/1982 | Matrone ............................ 324/754 |
| 4,538,104 | 8/1985 | Douglas et al. |
| 4,551,675 | 11/1985 | Heys et al. ........................ 324/754 |
| 4,636,723 | 1/1987 | Coffin. |
| 4,701,700 | 10/1987 | Jenkins. |
| 4,746,861 | 5/1988 | Nesbitt. |
| 4,771,234 | 9/1988 | Cook et al. |
| 4,799,006 | 1/1989 | Strohschneider. |
| 4,799,007 | 1/1989 | Cook et al. |
| 4,814,698 | 3/1989 | St. Onge et al. |
| 4,841,231 | 6/1989 | Angelucci. |
| 4,870,354 | 9/1989 | Davaut. |
| 4,947,112 | 8/1990 | Gaston et al. |
| 5,027,063 | 6/1991 | Letourneau ........................ 324/754 |
| 5,087,878 | 2/1992 | Belmore, III et al. |
| 5,200,694 | 4/1993 | Nesbitt et al. |
| 5,300,881 | 4/1994 | Ferrer et al. |
| 5,315,238 | 5/1994 | Barker. |

*Primary Examiner*—Kenneth A. Wieder
*Assistant Examiner*—Kourosh Cyrus Khosravi
*Attorney, Agent, or Firm*—Barlow & Barlow, Ltd.

[57] ABSTRACT

A test fixture for printed circuit boards having an initial seal member and a final seal member. The test fixture includes a probe plate with a pair of channels about its periphery for receiving a pair of seal members. An initial seal member is positioned in the outer channel in the probe plate to spring-bias the diaphragm board and provide an initial seal for the test fixture. A final seal member resides in the inner channel in the probe plate and provides an absolute seal for the test fixture. The final seal does not move during operation thereby reducing friction wear. The two seal members operate separately from one another and can be replaced individually without replacing the other.

18 Claims, 2 Drawing Sheets

TEST FIXTURE FOR PRINTED CIRCUIT BOARDS HAVING A DUAL SEAL SYSTEM

BACKGROUND OF THE INVENTION

The present invention relates generally to a test fixture for printed circuit boards. More specifically, the present invention relates to a test fixture for the automatic testing of printed circuit boards which includes an air-tight self-sealing system.

In the field of automatic testing equipment (ATE), it has been well known to employ a vacuum actuated test fixture for receiving electronic circuit devices to be tested and then electrically interconnecting the electronic circuit devices to the automatic testing equipment. In the prior art, it has become well known for the automatic testing equipment to include a plate, commonly referred to as a probe plate, for carrying an array of test probes. Also, a board is provided for carrying the electronic circuit device to be tested, commonly referred to a diaphragm board. The diaphragm board is typically positioned above and in spring-biased relation to the probe plate. As a result, a chamber is formed between the probe plate and the diaphragm board. To actuate the diaphragm board into contact with the test probes present on the probe plate for testing, air in the chamber is evacuated to create a vacuum therein. As a result, the diaphragm board is drawn toward the probe plate for testing of the electronic circuit device. The vacuum is maintained by a seal system present between the diaphragm board, probe plate and the electronic circuit board to be tested.

For example, U.S. Pat. No. 4,799,006, issued to Strohschneider, incorporated herein by reference, discloses a test fixture with a self-sealing vacuum skirt to ensure that the vacuum developed in the chamber between the diaphragm board and the probe plate is maintained to enable the electronic circuit device to dwell at the test probes in the probe plate for testing. In addition, U.S. Pat. No. 5,200,694, issued to Nesbitt et al., incorporated herein by reference, discloses a head assembly for a printed circuit board test fixture which includes another example of an attempt in the prior art to provide a seal for the chamber between the probe plate and the diaphragm board.

The prior art test fixtures for printed circuit boards typically include a vacuum-tight resilient member positioned between the lower probe plate and the movable diaphragm board which carries the electronic circuit device to be tested. Various structures have been attempted to achieve a quality seal, such as collapsible skirts and double seals which sit atop one another. Each of these attempts in the prior art suffer disadvantages in the way of cost of assembly, ease of assembly, ease of use, cost of maintenance and repair, and overall seal quality. For example, test fixtures which employ only one seal are inadequate because if that seal fails, a vacuum cannot be maintained. Complex seal member construction is also undesirable because the cost for materials and assembly is high. For example, an elaborate seal construction will typically require each corner of the test fixture to be mitered and glued thus increasing manufacturing costs. Seal arrangements, which require custom extruded components, are also disadvantageous. Further, test fixtures in the prior art, which employ two seals, are inadequate because they are integrated together requiring replacement of both seals even if only one seal fails.

Due to the demand for a test fixture which can create a quality seal at low cost, it is desirable for a test fixture to include two separate seal members which employ standard stock material which can be easily replaced upon wear or failure. It is also desirable to include a dual seal system where one seal may compensate for inadequacies in the other seal to ensure a complete and quality seal at each test cycle. It is desirable that no custom extruded parts or mitered and glued corners be required.

SUMMARY OF THE INVENTION

The present invention preserves the advantages of prior art automatic testing equipment test fixtures for printed circuit boards. In addition, it provides new advantages not found in currently available test fixtures, and overcomes many disadvantages of such currently available test fixtures.

The invention is generally directed to a novel and unique automatic testing equipment test fixture with particular application in testing printed circuit boards. The test fixture of the present invention enables the simple, easy and inexpensive assembly, use and maintenance of an automatic test fixture while producing a quality seal.

The preferred embodiment of the present invention includes four primary members. A probe plate, which supports an array of test probes, includes two substantially concentric channels extending down from its upper surface and proximal to its circumferential edge. The outer channel carries a resilient initial seal member while the second inner channel carries a resilient final seal member. A diaphragm board is positioned on the initial seal member which effectively spring-biases the diaphragm board relative to the probe plate.

In operation, a vacuum is introduced between the probe plate and the diaphragm board which effectively draws the diaphragm board down to the probe plate against the forces of the initial seal member. Upon initial engagement of the vacuum, initial seal member provides a dual function, it spring biases the diaphragm board relative to the probe plate as well as provides a seal between the diaphragm board and the probe plate. The diaphragm board continues to move down to contact the final seal member residing in the inner channel within the probe plate. Further movement causes the diaphragm board to contact a stop member which prevents the diaphragm board from touching the probe plate and thereby destroying the vacuum. At this point, the final seal provides the primary sealing while the initial seal continues to spring-bias the diaphragm board as well as provide back up sealing for the final seal member.

It is therefore an object of the present invention to provide an automatic testing equipment test fixture that can produce a quality seal between a probe plate and a diaphragm board carrying an electronic circuit device to be tested.

Another object of the present invention is to provide a test fixture which has two separate seals so in the event one seal fails, the other seal can compensate to achieve an overall complete seal.

It is a further object of the present invention to provide a test fixture that is inexpensive to produce and maintain by use of standard components.

It is yet a further object of the present invention to provide a test fixture which is reliable over a large number of test cycles.

It is another object of the present invention to provide a test fixture with a long seal life.

BRIEF DESCRIPTION OF THE DRAWINGS

The novel features which are characteristic of the present invention are set forth in the appended claims. However, the inventions preferred embodiments, together with further objects and attendant advantages, will be best understood by reference to the following detailed description taken in connection with the accompanying drawings in which:

DETAILED DESCRIPTION OF THE PREFERRED EMBODIMENT

Figure 1:
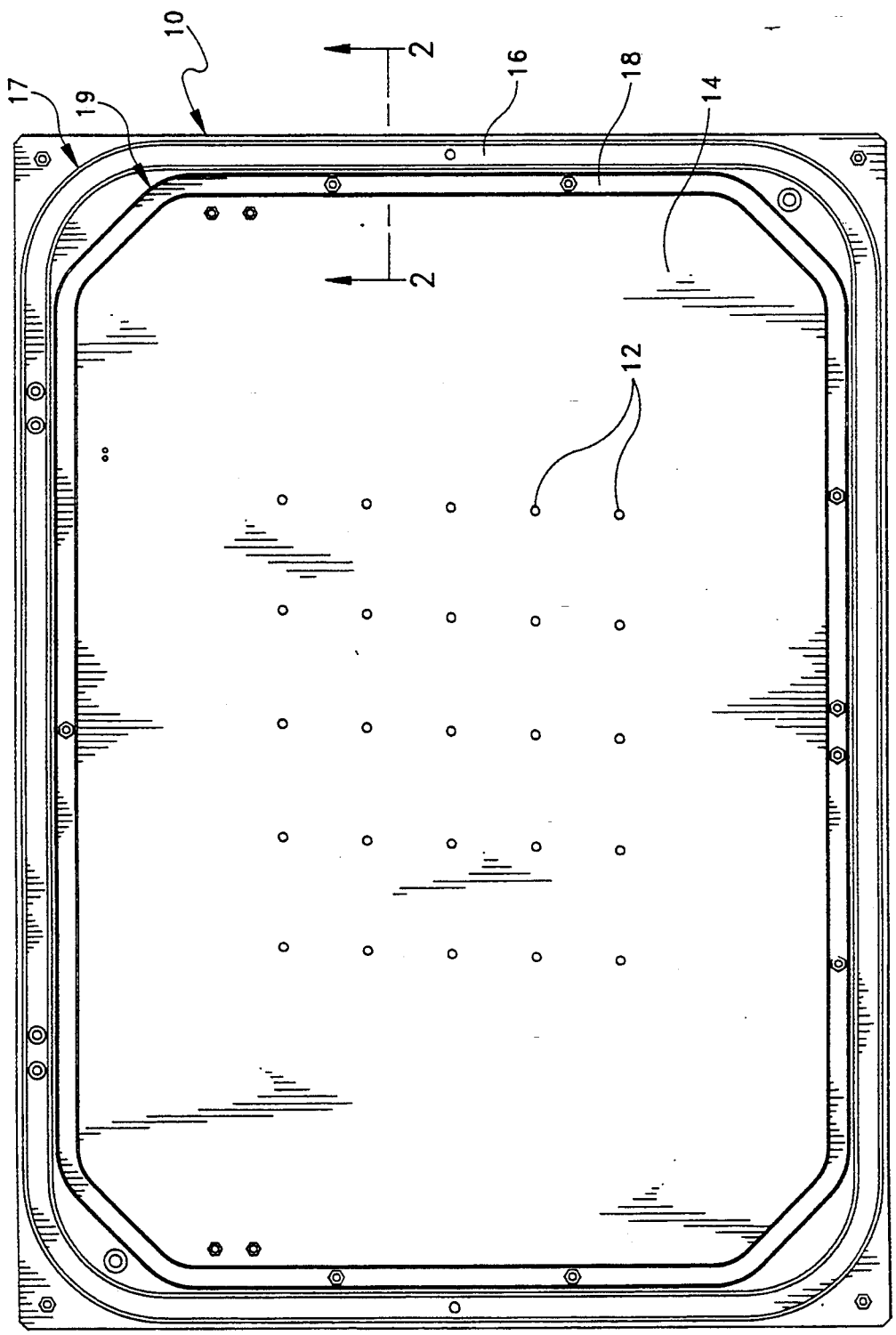
FIG. 1 is a plan view of the probe plate of the present invention.

Referring to FIG. 1, the probe plate 10 of the present invention is generally shown to include an upper surface 14 with an initial seal channel 16 and final seal channel 18 disposed therein. As can be seen, initial seal channel 16 and final seal channel 18 are substantially concentric with one another and positioned close to the peripheral edge of probe plate 10. Initial seal channel 16 includes rounded portions 17 at each of the corners of probe plate 10. Similarly, final seal channel 18 includes rounded corners 19 at each corner of probe plate 10. As will be discussed in detail below, the initial seal member and final seal member, which respectively reside in the initial seal channel 16 and final seal channel 18, are formed of a single length of seal material which need not be mitered and glued at each corner of probe plate 10. The seals employed by the present invention are each only glued once to connect their respective terminal ends together to form a ring-shaped seal. Alternatively, the seals of the presently invention may be easily formed by molding to generate a single piece unit.

Positioned Within the upper surface 14 of probe plate 10 is an array of contact probes 12 which are arranged in the appropriate position and configuration for testing as desired by the user. As known in the automatic testing equipment industry, contact probes 12 communicate with an electronic circuit device positioned on a diaphragm board which is actuated into close communication therewith.

Figure 2:
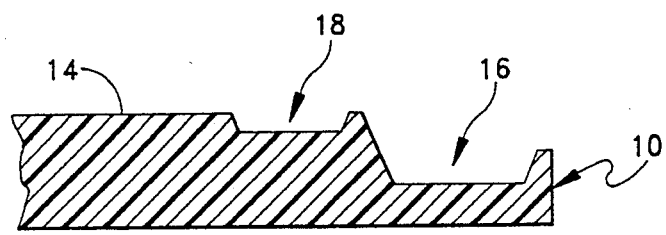
FIG. 2 is a cross-sectional view through the line 2—2 of the probe plate of FIG. 1.
Figure 3:
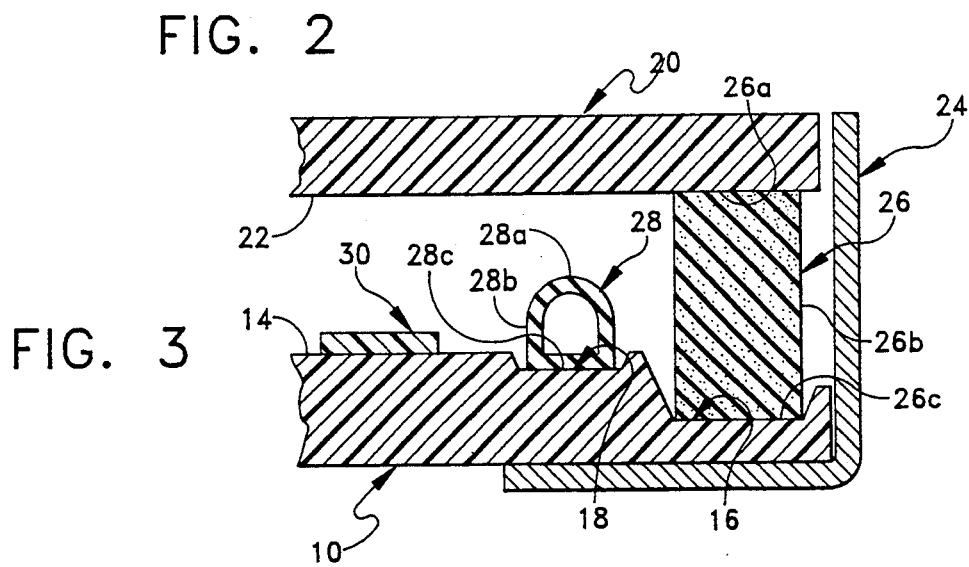
FIG. 3 is a partial sectional view illustrating the diaphragm board in an unactuated condition according to the present invention.

Turning now to FIG. 2, a cross-sectional view of probe plate 10 through 2—2 of FIG. 1 is shown. Probe plate 10 includes initial seal channel 16 and final seal channel 18 disposed in the upper surface 14 of probe plate 10. As will be apparent below, the depth of final seal channel 18 is deeper than the depth of initial seal channel 16 to accommodate the relative heights of the initial seal member 26 and final seal member 28 as shown in FIG. 3. While it is preferred that the initial seal channel 16 be deeper than final seal channel 18, other relative channel depths may be employed. For example, both channels could be of equal depth; however, the relative heights of the initial seal member 26 and final seal member 28 must be adjusted to compensate to ensure a quality dual seal. Probe plate 10 is preferably made of G-10/FR4 material which enables the manufacturer to easily form initial seal channel 16 and final seal channel 18 to the desired specifications.

In FIG. 3, a sectional view of a complete test fixture, according to the present invention, is shown. Probe plate 10 resides on support frame or trim ring 24. Residing within initial seal channel 16 is initial seal member 26 which is positioned within the entire length of initial seal channel 16 about the periphery of probe plate 10. Similarly, final seal member 28 resides in final seal channel 18 which is also positioned throughout final seal channel 18 about the periphery of probe plate 10. FIG. 3, which illustrates the test fixture of the present invention prior to application of a vacuum between probe plate 10 and diaphragm board 20, shows diaphragm board 20 resting on top surface 26a of initial seal member 26. Provided on upper surface 14 of probe plate 10 is stop member 30 which prevents diaphragm board 20 from contacting probe plate 10 when probe plate 20 is actuated upon the application of a vacuum.

Initial seal member 26 is preferably made of a foam elastomeric polyurethane material, such as PORON, with a height of 0.6 in. and a width of 0.38 in. While these are preferred materials and dimensions, other materials and dimensions may be employed to carry out the present invention. Further, final seal member 28 is preferably made of a stiffer elastomeric material, such as urethane or NEOPRENE with a height of 0.25 in. and a width of 0.25 in. Final seal member 28 is preferably tubular in configuration with a D-shaped cross-section. The flat portion 28c of final seal member 28 communicates with the floor of final seal channel 18 and is preferably glued thereto. The rounded upper portion 28a of final seal 28 contacts the lower surface 22 of diaphragm board 20 to form the final seal. The rounded upper surface 28a easily conforms to any flaws in the lower surface 22 of diaphragm board 20 to complete the final seal. Since final seal 28 is hollow, little set is required to complete the final seal. Initial seal member 26 preferably sits within initial seal channel 16 without an adhesive between lower surface 26c and the floor of initial seal channel 160 Initial seal member 26 may be adhered to a floor of initial seal channel 16 by glue, or the like. Stop members 30 (only one stop member shown for clarity) are also adhered to upper surface 14 of probe plate 10.

Figure 4:
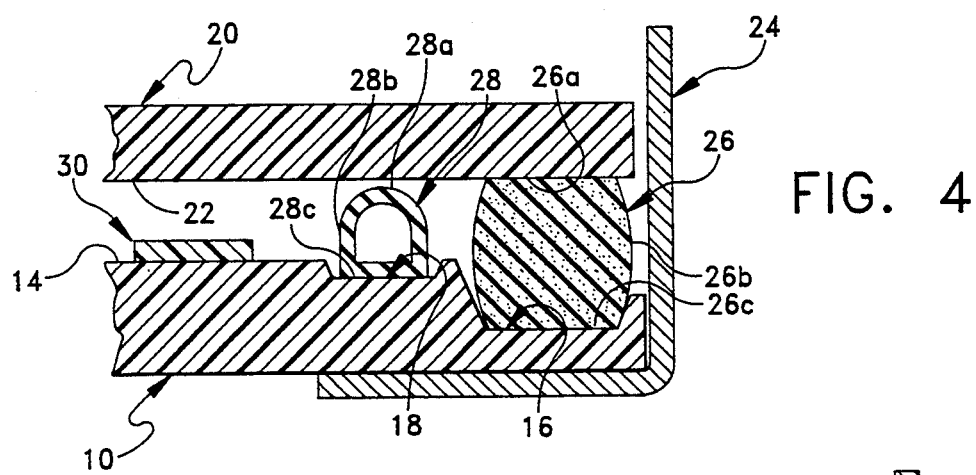
FIG. 4 is a partial sectional view illustrating the diaphragm board in a partially actuated condition according to the present invention.

FIG. 4 illustrates a cross-sectional view of the test fixture of the present invention after a vacuum has been applied between probe plate 10 and diaphragm board 20. As can be seen, diaphragm board 20 begins to actuate in a downward direction toward upper surface 14 against the spring-like forces of initial seal member 26. Due to its foam elastomer characteristics, initial seal member 26 acts to provide an initial seal about the periphery of the test fixture as well as spring-biasing diaphragm board 20 relative to probe plate 10. As diaphragm board 20 is drawn closer to probe plate 10, side walls 26b of initial seal member 26 bow out filling up initial seal channel 16. At this point, which occurs only a fraction of a second after the vacuum is applied, initial seal member 26 provides the only sealing between diaphragm board 20 and probe plate 10.

Figure 5:
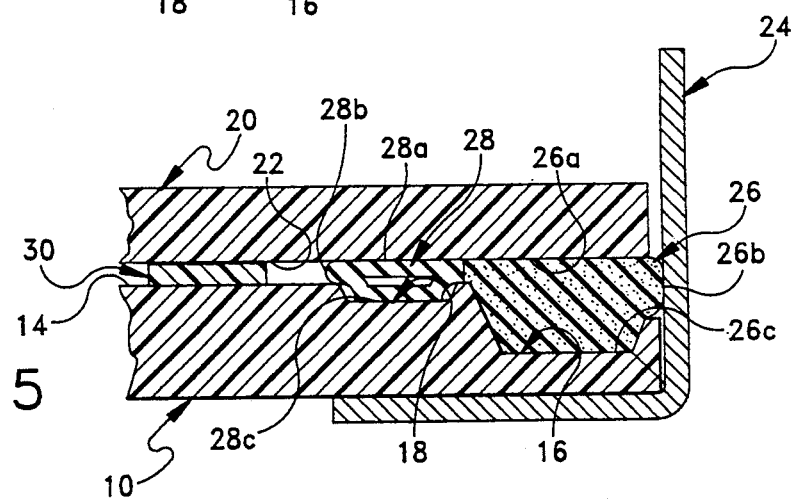
FIG. 5 is a partial sectional view of the test fixture illustrating the diaphragm board in a fully actuated condition in accordance with the present invention.

Further actuation of diaphragm board 20 down toward upper surface 14 of probe plate 10 by the vacuum being maintained between probe plate 10 and diaphragm board 20, brings diaphragm board 20 into contact with stop member 30. This further downward actuation of diaphragm board 20 causes the lower surface 22 of diaphragm board 20 to not only contact stop 30 but the top surface 28a of final seal member 28 thereby creating a final seal. As can be seen in FIG. 5, the sides 28b of final seal member 28 extend out laterally thereby creating a large upper surface 28a for providing sealing contact with lower surface 22 of diaphragm board 20. Upon final seal via final seal member 28, side walls 26b of initial seal member 26 extend farther out as shown in FIG. 4, to fill initial seal channel 16 to provide a quality back up seal to final seal member 28 while still providing the function of spring-biasing the diaphragm board 20 relative to the probe plate 10.

After the test cycle is completed, the vacuum between diaphragm board and probe plate 10 is removed which causes diaphragm 20 to lift off stop member 30 and final seal member 28 by the upward spring-like forces of initial seal member 26. As a result, the unactuated condition shown in FIG. 3 can then be realized and a new test cycle can begin.

Both the initial seal member 26 and final seal member 28 are made of common stock elastomer product which can be easily replaced with low cost to the user. In the event either one of the seal members fail, it can be quickly and easily replaced without requiring replacement of the entire seal system. Further, since both initial seal member 26 and final seal member 28 are both stationary during operation, friction wear is greatly reduced thereby extending the overall life of the seals.

It would be appreciated by those skilled in the art that various changes and modifications can be made to the illustrated embodiments without departing from the spirit of the present invention. All such modifications and changes are intended to be covered by the appended claims.

What is claimed is:

1. An automatic testing equipment test fixture for a printed circuit board, comprising:
  a probe plate having an upper surface and a circumferential edge; said probe plate including a first circumferential channel extending downward from said upper surface into said probe plate and being proximal to said circumferential edge; said probe plate further including a second circumferential channel, having a floor, extending downward from said upper surface into said probe plate and being substantially concentric with said first channel and positioned farther away from said circumferential edge than said first channel;
  a resilient initial seal member positioned in said first channel;
  a resilient final seal member positioned in said second channel; the height of the final seal member above the upper surface of the probe plate being less than the height of the initial seal member above the upper surface of the probe plate;
  a diaphragm board positioned on said resilient initial seal member with an air gap present between said diaphragm board and said final seal member;
  said initial seal member being compressible to permit movement of said diaphragm board into sealed engagement with said final seal member upon removal of air present between said diaphragm board and said probe plate to create a vacuum therebetween; and
  whereby said initial seal member and said final seal member cooperate to provide a double seal to contain said vacuum.

2. The test fixture of claim 1, wherein said first circumferential channel and said second circumferential channel are in spaced relation to one another within the upper surface of said probe plate.

3. The test fixture of claim 1, wherein said first circumferential channel is deeper than said second circumferential channel.

4. The test fixture of claim 1, wherein vacuum introduced between said probe plate and said diaphragm board draws said diaphragm board into sealed engagement with said final seal member.

5. The test fixture of claim 1, wherein said initial seal member is open cell elastomeric rubber.

6. The test fixture of claim 1, wherein said initial seal member is rectangular in cross-section.

7. The test fixture of claim 1, wherein said final seal member is closed cell elastomeric rubber.

8. The test fixture of claim 1, wherein said final seal member is substantially D-shaped in cross-section; the flat side of the final seal member being in contact with the floor of said second circumferential channel.

9. The test fixture of claim 1, wherein said final seal is adhered to the floor of said second circumferential channel.

10. The test fixture of claim 1, further comprising at least one stop member positioned on said probe plate to limit downward travel of said diaphragm board.

11. The test fixture at claim 1, further comprising:
  a support frame; said probe plate residing on said support frame.

12. A method for sealing a chamber between a probe plate and a diaphragm board in an automatic testing equipment test fixture for a printed circuit board, comprising the steps of:
  providing a probe plate having an upper surface and a circumferential edge;
  providing a first circumferential channel extending downward from said upper surface into said probe plate and being proximal to said circumferential edge;
  providing a second circumferential channel, having a floor, extending downward from said upper surface into said probe plate which is substantially concentric with said first channel and positioned farther away from said circumferential edge than said first channel;
  positioning a resilient initial seal member in said first channel;
  positioning a resilient final seal member in said second channel which has a height above the upper surface of the probe plate less than the height of the initial seal member above the upper surface of the probe plate;
  positioning a diaphragm board on said resilient initial seal member with an air gap between said diaphragm board and said final seal member to create a chamber between the diaphragm board and the probe plate;
  creating a vacuum in said chamber;
  drawing said diaphragm board toward said probe plate to compress only said initial seal member;
  forming an initial seal between said diaphragm board and said probe plate via said initial seal member;

drawing said diaphragm board further toward said probe plate to further compress said initial seal member and to compress said final seal member; and forming a final seal between said diaphragm board and said probe plate via said final seal member.

13. The method of claim 12, further comprising the step of:

providing said first circumferential channel with a greater depth than said second circumferential channel.

14. The method of claim 12, further comprising the step of:

providing a resilient initial seal member made of open cell elastomeric rubber having a rectangular cross-section.

15. The method of claim 12, further comprising the step of:

providing a resilient final seal member made of closed cell elastomeric rubber having a D-shaped cross-section with its flat side in contact with the floor of the second circumferential channel.

16. The method of claim 12, further comprising the step of:

adhering said final seal member to the floor of the second circumferential channel.

17. The method of claim 12, further comprising the step of:

stopping the travel of said diaphragm board toward said probe plate before said diaphragm board contacts said probe plate.

18. The method of claim 12, further comprising the step of:

providing a support frame for carrying said probe plate.

* * * * *